(12) United States Patent
Shank et al.

(10) Patent No.: US 11,545,549 B2
(45) Date of Patent: Jan. 3, 2023

(54) SEMICONDUCTOR STRUCTURES WITH BODY CONTACT REGIONS EMBEDDED IN POLYCRYSTALLINE SEMICONDUCTOR MATERIAL

(71) Applicant: GLOBALFOUNDRIES U.S. Inc., Santa Clara, CA (US)

(72) Inventors: Steven M. Shank, Jericho, VT (US); Siva P. Adusumilli, South Burlington, VT (US); Yves Ngu, Williston, VT (US); Michael Zierak, Colchester, VT (US)

(73) Assignee: GlobalFoundries U.S. Inc., Santa Clara, CA (US)

(*) Notice: Subject to any disclaimer, the term of this patent is extended or adjusted under 35 U.S.C. 154(b) by 1 day.

(21) Appl. No.: 17/029,667

(22) Filed: Sep. 23, 2020

(65) Prior Publication Data
US 2022/0093744 A1 Mar. 24, 2022

(51) Int. Cl.
*H01L 29/10* (2006.01)
*H01L 27/12* (2006.01)
*H01L 29/04* (2006.01)
*H01L 21/763* (2006.01)

(52) U.S. Cl.
CPC ........ *H01L 29/1095* (2013.01); *H01L 21/763* (2013.01); *H01L 27/1203* (2013.01); *H01L 29/04* (2013.01)

(58) Field of Classification Search
CPC ... H01L 21/763; H01L 21/76; H01L 21/7624; H01L 21/76264; H01L 21/76289; H01L 21/764; H01L 29/04; H01L 27/1203; H01L 27/12; H01L 27/1207; H01L 27/1211
See application file for complete search history.

(56) References Cited

U.S. PATENT DOCUMENTS

| | | | |
|---|---|---|---|
| 6,409,989 B2 | 6/2002 | Matianich et al. | |
| 6,437,405 B2 | 8/2002 | Kim | |
| 10,062,711 B2 | 8/2018 | Shank et al. | |
| 10,170,661 B2 | 1/2019 | Assefa et al. | |
| 10,192,779 B1 | 1/2019 | Shank et al. | |
| 2018/0175064 A1* | 6/2018 | Shank | H01L 29/0649 |
| 2018/0337146 A1* | 11/2018 | Englekirk | H01L 27/1203 |

* cited by examiner

*Primary Examiner* — Julio J Maldonado
*Assistant Examiner* — Stanetta D Isaac
(74) *Attorney, Agent, or Firm* — Thompson Hine LLP; Francois Pagette (57) ABSTRACT

Body-contacted semiconductor structures and methods of forming a body-contacted semiconductor structure. A semiconductor substrate, which contains of a single-crystal semiconductor material, includes a device region and a plurality of body contact regions each comprised of the single-crystal semiconductor material. A polycrystalline layer and polycrystalline regions are formed in the semiconductor substrate. The polycrystalline regions are positioned between the polycrystalline layer and the device region, and the polycrystalline regions have a laterally-spaced arrangement with a gap between each adjacent pair of the polycrystalline regions. One of the plurality of body contact regions is arranged in the gap between each adjacent pair of the polycrystalline regions.

20 Claims, 7 Drawing Sheets

SEMICONDUCTOR STRUCTURES WITH BODY CONTACT REGIONS EMBEDDED IN POLYCRYSTALLINE SEMICONDUCTOR MATERIAL

BACKGROUND

The present invention relates to semiconductor device fabrication and integrated circuits and, more specifically, to body-contacted semiconductor structures and methods of forming a body-contacted semiconductor structure.

Semiconductor device structures, such as high-voltage power electronic devices, are susceptible to high capacitance and body-to-body leakage when formed using a bulk semiconductor wafer. A measure that may be taken to reduce the susceptibility is to provide the bulk semiconductor wafer with triple well isolation that surrounds an active region containing the device structure. Another measure that may be taken to reduce the susceptibility is to replace the bulk wafer with a silicon-on-insulator wafer in which a thin silicon layer furnishes an active region and a buried oxide layer is arranged between the active region and the substrate beneath the buried insulator layer.

A bank or stack of switch field-effect transistors may encounter limitations on upward width scaling because of body contact requirements dictated by maximum power handling capability (Pmax) and linearity. As the width is increased, the body voltage may become unevenly distributed across the switch field-effect transistors in the bank.

Improved body-contacted semiconductor structures and methods of forming a body-contacted semiconductor structure are needed.

SUMMARY

In an embodiment of the invention, a structure includes a semiconductor substrate comprised of a single-crystal semiconductor material. The semiconductor substrate includes a device region and a plurality of body contact regions each comprised of the single-crystal semiconductor material. The structure includes a polycrystalline layer and a plurality of polycrystalline regions in the semiconductor substrate. The plurality of polycrystalline regions are positioned between the polycrystalline layer and the device region, and the plurality of polycrystalline regions have a laterally-spaced arrangement with a gap between each adjacent pair of the plurality of polycrystalline regions. One of the plurality of body contact regions is arranged in the gap between each adjacent pair of the plurality of polycrystalline regions.

In an embodiment of the invention, a method includes forming a polycrystalline layer in a semiconductor substrate comprised of a single-crystal semiconductor material, and forming a plurality of polycrystalline regions in the semiconductor substrate. The semiconductor substrate includes a device region and a plurality of body contact regions each comprised of the single-crystal semiconductor material. The plurality of polycrystalline regions are positioned between the polycrystalline layer and the device region, the plurality of polycrystalline regions have a laterally-spaced arrangement with a gap between each adjacent pair of the plurality of polycrystalline regions, and one of the plurality of body contact regions is arranged in the gap between each adjacent pair of the plurality of polycrystalline regions.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
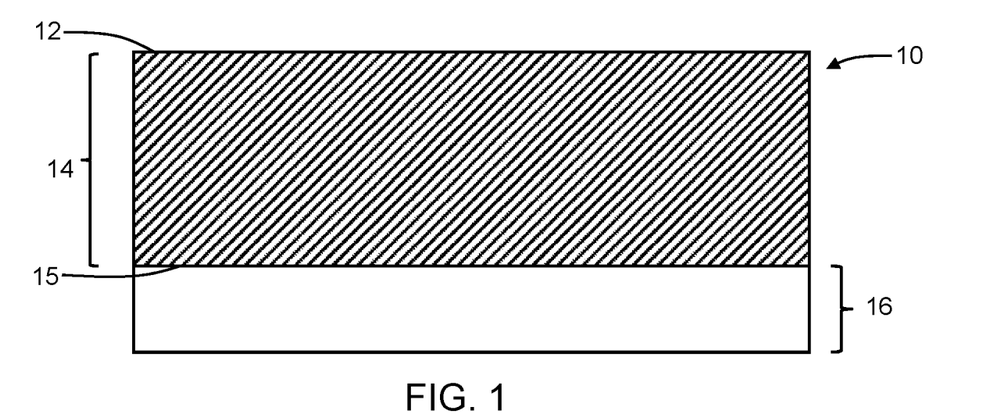
FIGS. 1-3 are cross-sectional views of a structure at successive fabrication stages of a processing method in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 may be a bulk substrate containing single-crystal semiconductor material (e.g., single-crystal silicon). In an embodiment, the semiconductor substrate 10 may be a high-resistivity bulk substrate containing single-crystal silicon having an electrical resistivity greater than or equal to 1,000 ohm-cm. In an embodiment, the semiconductor substrate 10 may be a high-resistivity bulk substrate containing single-crystal silicon having an electrical resistivity greater than or equal to 1,000 ohm-cm to 50,000 ohm-cm. In an alternative embodiment, the semiconductor substrate 10 may be a low-resistivity bulk substrate containing single-crystal silicon having an electrical resistivity less than 1,000 ohm-cm.

An implanted layer 14 containing damaged or amorphous semiconductor material is formed in the semiconductor substrate 10 beneath a top surface 12 of the semiconductor substrate 10. The implanted layer 14 may be formed by an ion implantation process that introduces energetic ions with ion trajectories that impinge the top surface 12 and travel in paths within the semiconductor substrate 10. The energetic ions lose energy along their paths via stochastic scattering events with atomic nuclei and electrons in the traversed semiconductor material. Energy lost in nuclear collisions displaces target atoms of the semiconductor substrate 10 from their original lattice sites, which damages the crystal lattice structure of the semiconductor substrate 10 and generates point defects. The crystal lattice structure of the semiconductor substrate 10 is damaged or amorphized within the implanted layer 14 in comparison with an undamaged region 16 of the single-crystal semiconductor material of the semiconductor substrate 10 positioned below a lower boundary 15 of the implanted layer 14. In an embodiment, the implanted layer 14 may extend from the lower boundary 15 to the top surface 12. The implanted layer 14 of the semiconductor substrate 10 may be changed from crystalline semiconductor material (e.g., single-crystal silicon) to damaged or amorphous semiconductor material (e.g., amorphous silicon) as a consequence of the use of a high dose of the implanted species.

The ions may be generated from a suitable source gas and implanted into the semiconductor substrate 10 with one or more implantation conditions using an ion implantation tool. The implantation conditions (e.g., ion species, dose, energy) for the ion implantation process may be selected to tune the characteristics of the implanted layer 14. In an embodiment, the ions may be generated from a noble gas, such as argon or xenon. In an embodiment in which the semiconductor substrate 10 is to remain crystalline at the top surface 12, the ion dose may be selected to be less than a threshold ion dose beyond which recrystallization of the damaged semiconductor material in the implanted layer 14 by a subsequent anneal is not possible. In an embodiment, the dose of argon ions may be greater than to $1 \times 10^{14}$ ions/cm$^2$. In an embodiment, the dose of argon ions may range from $1 \times 10^{14}$ ions/cm$^2$ to $5 \times 10^{15}$ ions/cm$^2$. In an embodiment, the energy of the argon ions may range from about 30 keV to about 1000 keV. The dose and energy for other implanted noble gas ion species may be similar or different to those of argon. The ion implantation conditions may include a single implantation, multiple implantations performed at different energies, segmented implantations, etc. A thin silicon dioxide layer (not shown) may be applied to the top surface 12 of the semiconductor substrate 10 before performing the ion implantation process and may be removed following the completion of all ion implantation processes.

Figure 2:
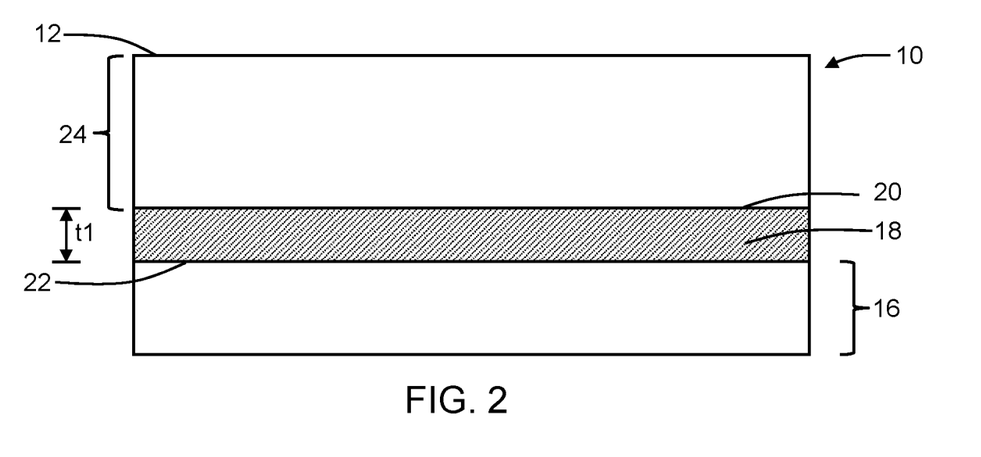

With reference to FIG. 2 in which like reference numerals refer to like features in FIG. 1 and at a subsequent fabrication stage of the processing method, a portion of the damaged semiconductor material in the implanted layer 14 is converted into a polycrystalline layer 18 in the semiconductor substrate 10 by performing a thermal treatment (i.e., annealing process). In an embodiment, the thermal treatment used to thermally treat the implanted layer 14 of the semiconductor substrate 10 and form the polycrystalline layer 18 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 5 seconds and, in a particular embodiment, the peak temperature may be 1000° C. held for a dwell time of less than or equal to 1 second.

The polycrystalline layer 18 contains grains of polycrystalline semiconductor material (e.g., polysilicon). The polycrystalline layer 18 may also contain defects as residual damage in addition to the polycrystalline grains, and the defects may contain trapped atoms of the implanted species (e.g., argon or xenon). The thermal treatment also recrystallizes the damaged semiconductor material of the implanted layer 14 between the polycrystalline layer 18 and the top surface 12 into a layer 24 of the semiconductor substrate 10 that includes single-crystal semiconductor material (e.g., single-crystal silicon). In contrast to the polycrystalline layer 18, the recrystallized single-crystal semiconductor material in the layer 24 lacks polycrystalline grains and defects, and may also lack atoms of the implanted species.

The recrystallized single-crystal layer 24 is located between an upper boundary 20 of the polycrystalline layer 18 and the top surface 12 of the semiconductor substrate 10. The semiconductor substrate 10 also includes single-crystal semiconductor material in the undamaged region 16 below a lower boundary 22 of the polycrystalline layer 18. As a result, the polycrystalline layer 18 is buried beneath the top surface 12 and embedded in single-crystal semiconductor material of the semiconductor substrate 10. The polycrystalline layer 18 has a thickness, t1, in a vertical direction between the boundaries 20, 22. In an embodiment, the thickness, t1, of the polycrystalline layer 18 may be less than the thickness of the implanted layer 14 (FIG. 1).

The polycrystalline layer 18 may be characterized as trap-rich material having an electrical resistivity that is greater than or equal to the electrical resistivity of the single-crystal semiconductor material of the semiconductor substrate 10. In an embodiment, the polycrystalline layer 18 may have an electrical resistivity that is greater than or equal to 1,000 ohm-cm. In an embodiment, the electrical resistivity of the polycrystalline layer 18 may be within a range of 10,000 ohm-cm to 1,000,000 ohm-cm. In an embodiment, the single-crystal semiconductor material of the substrate may have an electrical resistivity of 1,000 to 10,000 ohm-cm, and the polycrystalline layer 18 may have an electrical resistivity that is 10 times to 100 times greater (i.e., within a range of 10,000 to 1,000,000 ohm-cm).

Figure 3:
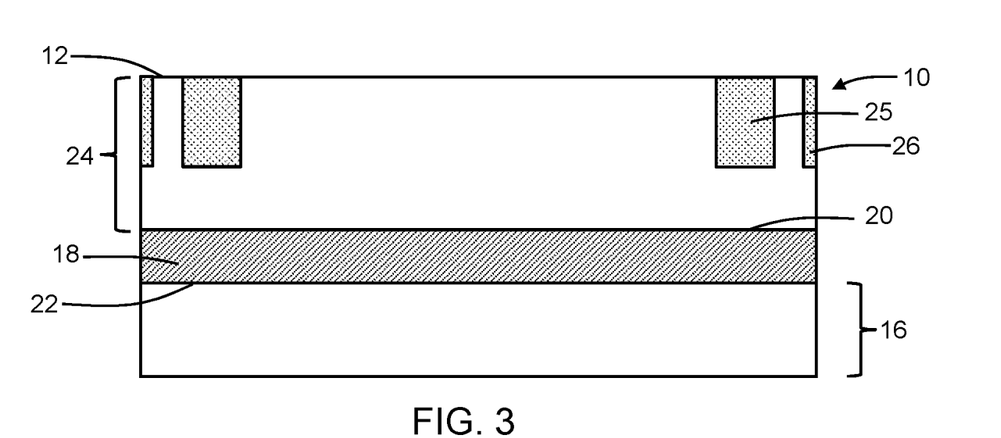
Figure 4:
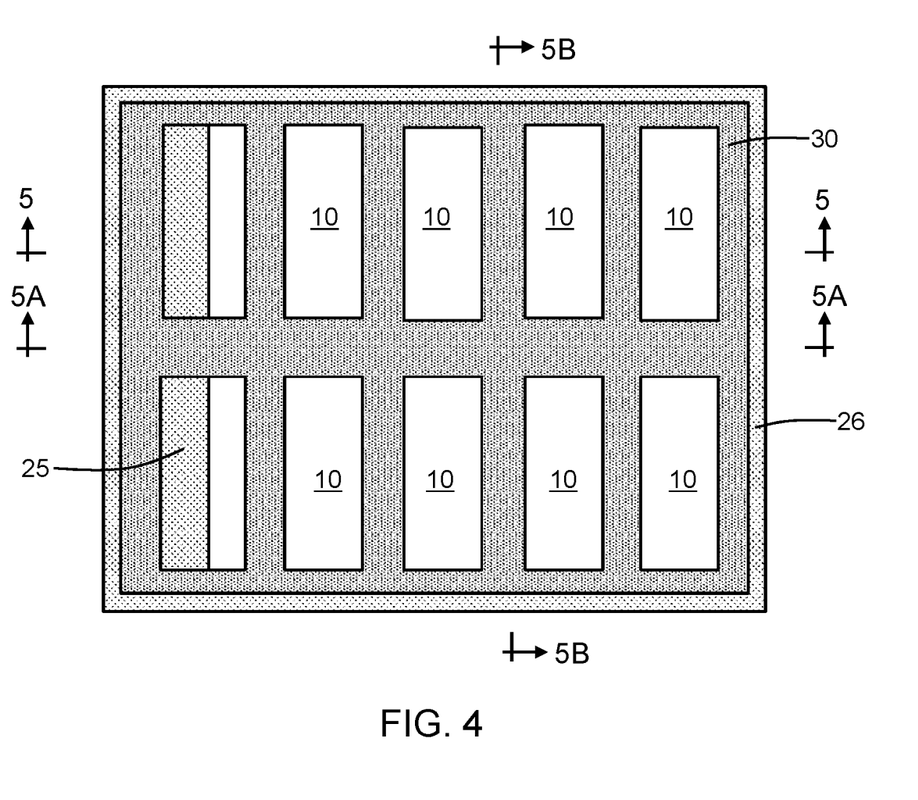
FIG. 4 is a top view of the structure at a fabrication stage subsequent to FIG. 3.

With reference to FIG. 3 in which like reference numerals refer to like features in FIG. 2 and at a subsequent fabrication stage of the processing method, shallow trench isolation regions 25, 26 are formed that extend from the top surface 12 of the semiconductor substrate 10 to a shallow depth into the semiconductor substrate 10. The shallow trench isolation regions 25, 26 may contain a dielectric material deposited by chemical vapor deposition into trenches etched in the semiconductor substrate 10 by a masked etching process, polished, and deglazed. The dielectric material contained in the shallow trench isolation regions 25, 26 may be silicon dioxide, silicon nitride, silicon carbide, silicon-rich silicon dioxide, or a combination of two or more of these materials.

The shallow trench isolation regions 25, 26 extend to a depth in the semiconductor substrate 10 that is shallower than the upper boundary 20 of the polycrystalline layer 18. As a consequence, portions of the recrystallized single-crystal layer 24 of the semiconductor substrate 10 are positioned between the shallow trench isolation regions 25, 26 and the polycrystalline layer 18. The shallow trench isolation regions 25, 26 surround and isolate an active region of the semiconductor substrate 10.

With reference to FIGS. 4, 5, 5A, 5B in which like reference numerals refer to like features in FIG. 3 and at a subsequent fabrication stage of the processing method, implanted regions 28 are formed in the semiconductor substrate 10. To that end, a patterned implantation mask 30 is formed to define selected areas on the top surface 12 that are exposed for ion implantation to form the implanted regions 28. The implantation masks cover different areas on the top surface 12 in order to determine, at least in part, the location and horizontal dimensions of the implanted regions 28. The implantation mask may include a layer of a material, such as an organic photoresist, that is applied and patterned such that non-selected areas on the top surface 12 are covered and masked. The implantation mask has a thickness and stopping power sufficient to block the masked areas of the top surface 12 against receiving a dose of the implanted ions.

Implanted regions 28 containing damaged or amorphous semiconductor material are formed in the semiconductor substrate 10 beneath a top surface 12 of the semiconductor substrate 10. The implanted regions 28 may be formed by an ion implantation process that introduces energetic ions with ion trajectories that impinge the masked top surface 12 and travel in paths within the semiconductor substrate 10. The energetic ions lose energy along their paths via stochastic scattering events with atomic nuclei and electrons in the traversed semiconductor material. Energy lost in nuclear collisions displaces target atoms of the semiconductor substrate 10 from their original lattice sites, which damages the crystal lattice structure of the semiconductor substrate 10 and generates point defects. The crystal lattice structure of the semiconductor substrate 10 is damaged or amorphized within the implanted regions 28 in comparison with undamaged regions of the single-crystal semiconductor material of the semiconductor substrate 10 that are laterally arranged between the implanted regions 28. The implanted regions 28 of the semiconductor substrate 10 may be changed from crystalline semiconductor material (e.g., single-crystal silicon) to damaged or amorphous semiconductor material (e.g., amorphous silicon) as a consequence of the use of a high dose of the implanted species.

The ions may be generated from a suitable source gas and implanted into the semiconductor substrate 10 with one or more implantation conditions using an ion implantation tool. The implantation conditions (e.g., ion species, dose, energy) for the ion implantation process may be selected to tune the characteristics of the implanted regions 28. In an embodiment, the ions may be generated from a noble gas, such as argon or xenon. In an embodiment, the dose of argon ions may be greater than to $1\times10^{14}$ ions/cm$^2$. In an embodiment, the dose of argon ions may be within a range of $1\times10^{14}$ ions/cm$^2$ to $5\times10^{15}$ ions/cm$^2$. In an embodiment, the energy of the argon ions may be in a range of about 30 keV to about 1000 keV. The dose and energy for other implanted noble gas ion species could be similar or different to those for argon. The ion implantation conditions may include a single implantation, multiple implantations performed at different energies, segmented implantations, etc.

The implanted regions 28 in the active region may extend from the top surface 12 of the semiconductor substrate 10 to the polycrystalline layer 18. In an embodiment, the implanted regions 28 may overlap with the polycrystalline layer 18 at its upper boundary 20. The implanted regions 28 at the periphery of the active region may also overlap in part with the shallow trench isolation regions 25, 26. Portions of the implantation mask 30 cover non-implanted regions 32 that are positioned between adjacent implanted regions 28. Portions of the implantation mask 30 cover a non-implanted region 34 that extends about the entire outer periphery or perimeter of the active region. The non-implanted region is positioned laterally between the shallow trench isolation region 25 and the shallow trench isolation region 26. A portion of the implantation mask 30 covers a non-implanted region 36 that extends transverse to the non-implanted regions 32. The non-implanted region 36 may be centrally located in the active region between different sets of the implanted regions 28. The non-implanted regions 32, 34, 36 contain single-crystal semiconductor material of the recrystallized single-crystal layer 24 of the semiconductor substrate 10.

Figure 5:
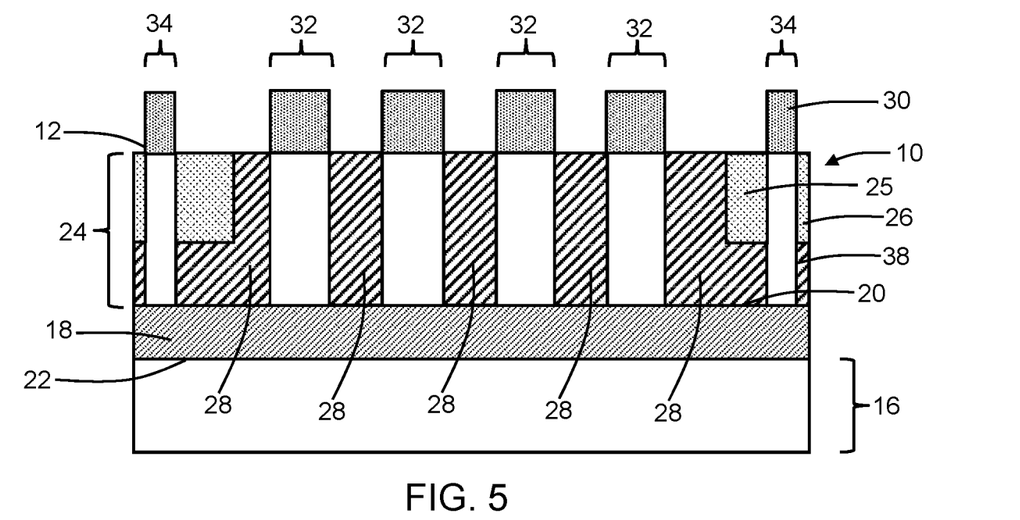
FIG. 5 is a cross-sectional view taken generally along 5-5 in FIG. 4.
Figure 5A:
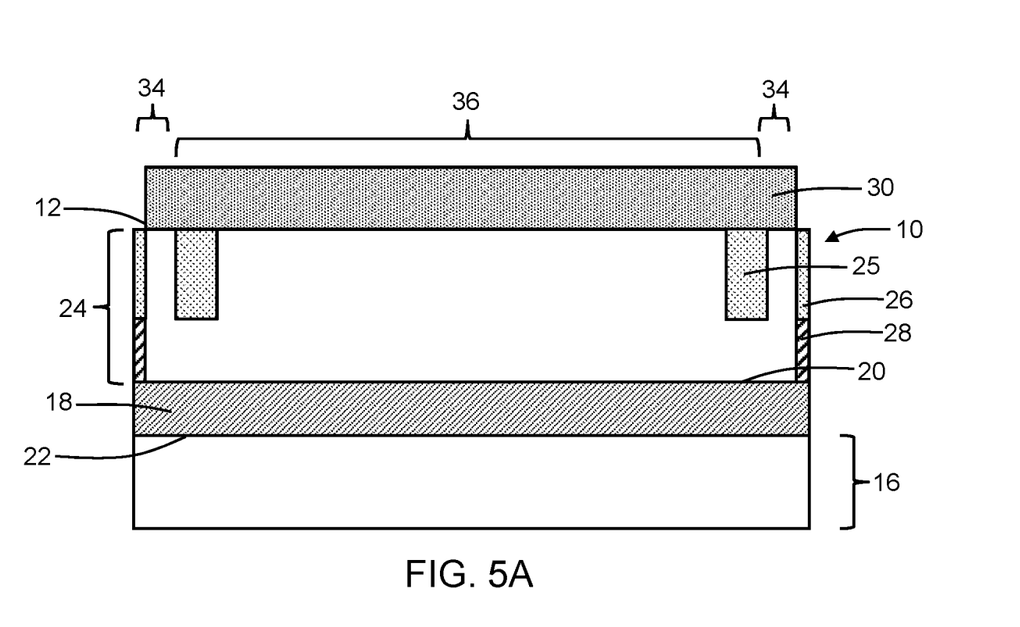
FIG. 5A is a cross-sectional view taken generally along 5A-5A in FIG. 4.
Figure 5B:
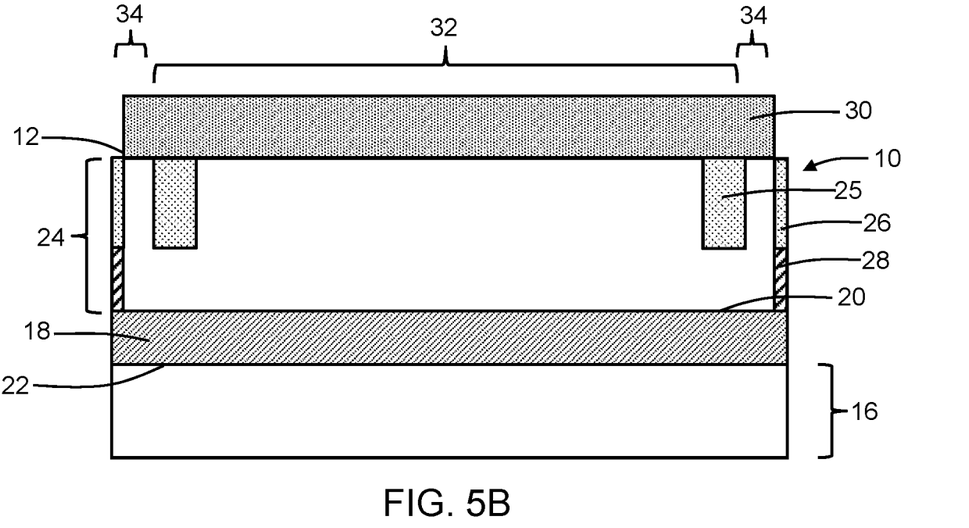
FIG. 5B is a cross-sectional view taken generally along 5B-5B in FIG. 4.
Figure 6:
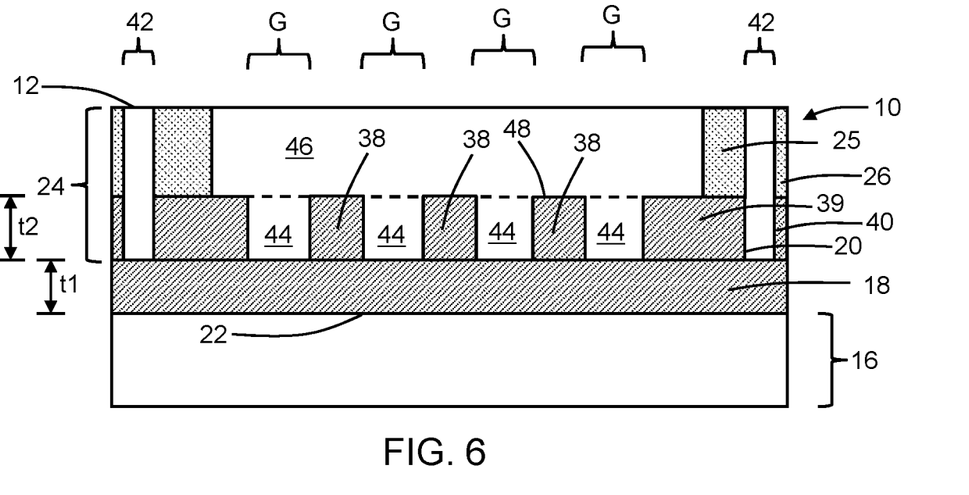
FIGS. 6, 6A, 6B are cross-sectional views of the structure at a fabrication stage subsequent to FIGS. 5, 5A, 5B.
Figure 6A:
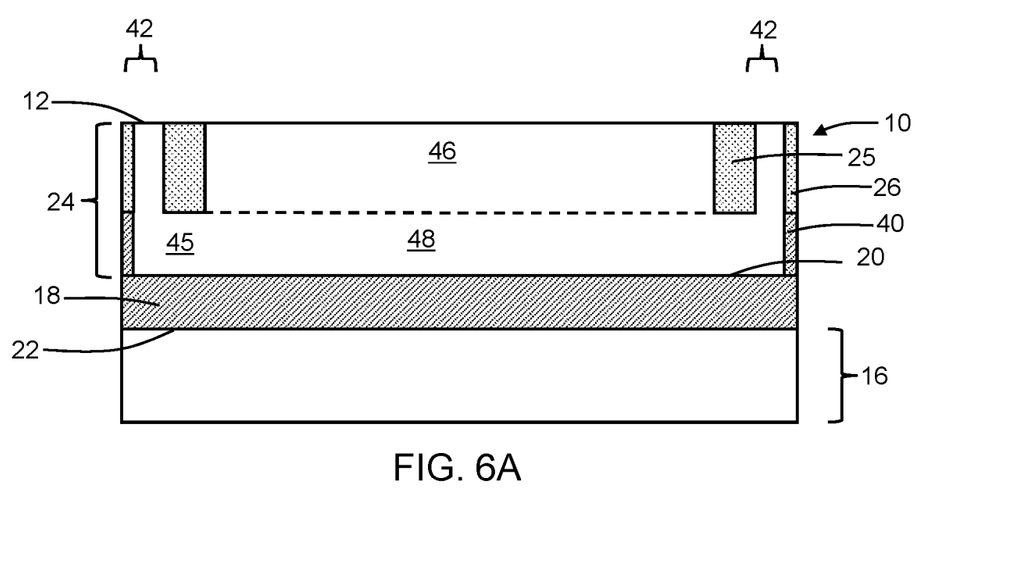
Figure 6B:
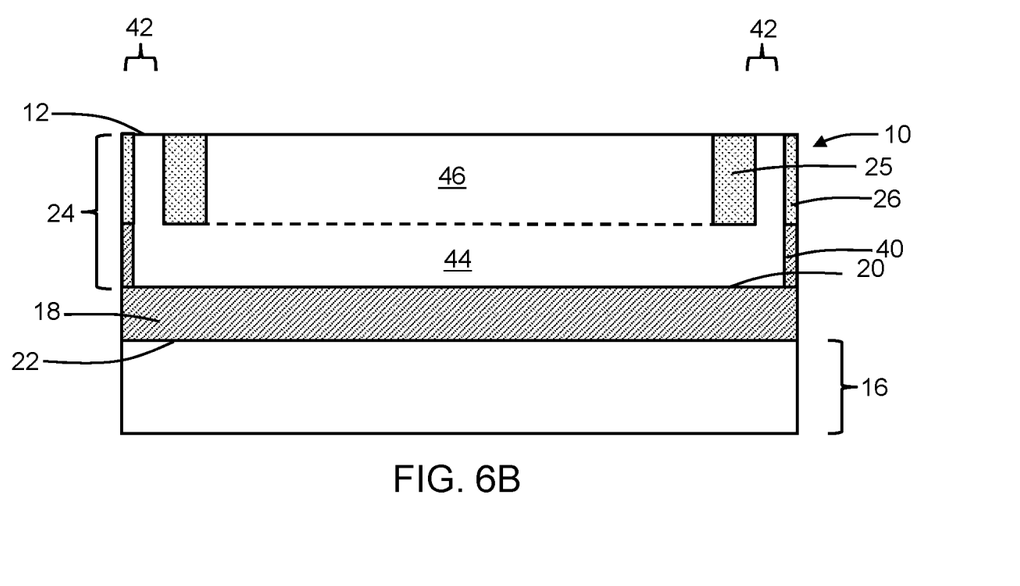

With reference to FIGS. 6, 6A, 6B in which like reference numerals refer to like features in FIGS. 5, 5A, 5B and at a subsequent fabrication stage of the processing method, the implanted regions 28 are converted into polycrystalline regions 38, 39, 40 in the semiconductor substrate 10 by performing a thermal treatment (i.e., annealing process). In an embodiment, the thermal treatment used to thermally treat the implanted regions 28 of the semiconductor substrate 10 and form the polycrystalline regions 38, 39, 40 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 5 seconds and, in a particular embodiment, the peak temperature may be 1000° C. held for a dwell time of less than or equal to 1 second.

The polycrystalline regions 38, 39, 40 contain grains of polycrystalline semiconductor material (e.g., polysilicon). The polycrystalline regions 38, 39, 40 may also contain defects as residual damage in addition to the polycrystalline grains, and the defects may contain trapped atoms of the implanted species (e.g., argon or xenon). The thermal treatment also recrystallizes the damaged semiconductor material of the implanted regions 28 between the polycrystalline regions 38 and the top surface 12 into single-crystal semiconductor material (e.g., single-crystal silicon) belonging to the recrystallized layer 24 of the semiconductor substrate 10.

The polycrystalline regions 38 are located between the upper boundary 20 of the polycrystalline layer 18 and the top surface 12 of the semiconductor substrate 10. A portion of the single-crystal semiconductor material of the layer 24 is positioned between each polycrystalline region 38 and the top surface 12. The polycrystalline region 39 is located in part between the upper boundary 20 of the polycrystalline layer 18 and the shallow trench isolation region 25 and in part between the upper boundary 20 of the polycrystalline layer 18 and the top surface 12. The polycrystalline region 40 is located between the upper boundary 20 of the polycrystalline layer 18 and the shallow trench isolation region 26. The shallow trench isolation regions 25, 26 are positioned between the polycrystalline regions 39, 40 and the top surface 12. A lower portion of each of the polycrystalline regions 38, 39, 40 may intercept and/or be coextensive with the polycrystalline layer 18 at its upper boundary 20.

Similar to the polycrystalline layer 18, the polycrystalline regions 38, 39, 40 may be characterized as trap-rich material having an electrical resistivity that is greater than or equal to the electrical resistivity of the single-crystal semiconductor material of the semiconductor substrate 10. In an embodiment, the polycrystalline regions 38, 39, 40 may have an electrical resistivity that is greater than or equal to 1,000 ohm-cm. In an embodiment, the electrical resistivity of the polycrystalline layer 18 may be within a range of 10,000 ohm-cm to 1,000,000 ohm-cm. In an embodiment, the single-crystal semiconductor material of the substrate may have an electrical resistivity of 1,000 to 10,000 ohm-cm, and the polycrystalline layer 18 may have an electrical resistivity that is 10 times to 100 times greater (i.e., within a range of 10,000 to 1,000,000 ohm-cm).

The recrystallized single-crystal layer 24 includes a body contact region 42 that is laterally positioned between the shallow trench isolation region 25 and the shallow trench isolation region 26. The recrystallized single-crystal layer 24 includes body contact regions 44 that are positioned between in the gaps, G, between adjacent pairs of the polycrystalline regions 38, 39, a body contact region 48 that extends transverse to the body contact regions 44, and a device region 46 that is positioned above the polycrystalline regions 38, 39 and the body contact regions 44. The device region 46 is positioned between the body contact regions 44 and the top surface 12. The body contact region 42 of the layer 24 extends fully about (i.e., fully surrounds) the entire outer periphery or perimeter of the device region 46. The body contact region 48 extends through a break or gap 45 in the polycrystalline region 39 to provides a connection between the single-crystal semiconductor material in the body contact region 42 and the single-crystal semiconductor material in the body contact regions 44. The break in the polycrystalline semiconductor material is located beneath a segment or portion of the shallow trench isolation region 25. The polycrystalline layer 18 is arranged beneath all of the regions 42, 44, 46, 48. The shallow trench isolation region 25 fully surrounds the device region 46, and the shallow trench isolation region 26 fully surrounds the shallow trench isolation region 25.

One of the body contact regions 44 is positioned in each of the gaps, G, between adjacent pairs of the polycrystalline regions 38, 39 and, in an embodiment, may fully fill each gap, G. The body contact regions 44 may be located at and below an upper boundary 49 of the polycrystalline regions 38, 39 as diagrammatically indicated by the horizontal dashed line. The polycrystalline regions 38, 39, 40 have a thickness, t2, in a vertical direction, and the body contact regions 44 may have a thickness equal to the thickness, t2. In an embodiment, the thickness of the polycrystalline regions 38, 39, 40 may be less than the thickness of the implanted regions 28 (FIG. 3) in that only a lower portion of each implanted region 28 is converted to polycrystalline semiconductor material. The total thickness of high-resistivity, trap-rich material at the location of the polycrystalline regions 38, 39, 40 is effectively equal to the sum of the thickness, t1, and the thickness, t2, whereas the total thickness of high-resistivity, trap-rich material at the location of the body contact regions 42, 44, 48 is equal to the thickness, t1. In combination, the different thicknesses of high-resistivity, trap-rich material impart a corrugated shape.

The device region 46 may be doped to form a well having a conductivity type of a given polarity. The well may be formed by introducing a dopant by, for example, ion implantation with given implantation conditions into the device region 46. The implantation conditions (e.g., ion species, dose, kinetic energy) may be selected to tune the electrical and physical characteristics of the well in the device region 46. In an embodiment, the well may contain semiconductor material doped with a p-type dopant (e.g., boron) to provide p-type electrical conductivity.

The device region 46 has a higher electrical conductivity (i.e., a lower electrical resistivity) than the body contact regions 44, 48 following the formation of the well in the device region 46. In an embodiment, the body contact regions 44, 48 may be undoped in contrast to the device region 46. In an embodiment, the body contact regions 44 may be doped to have the same conductivity type as the device region 46 but at a significantly lower dopant concentration.

Figure 7:
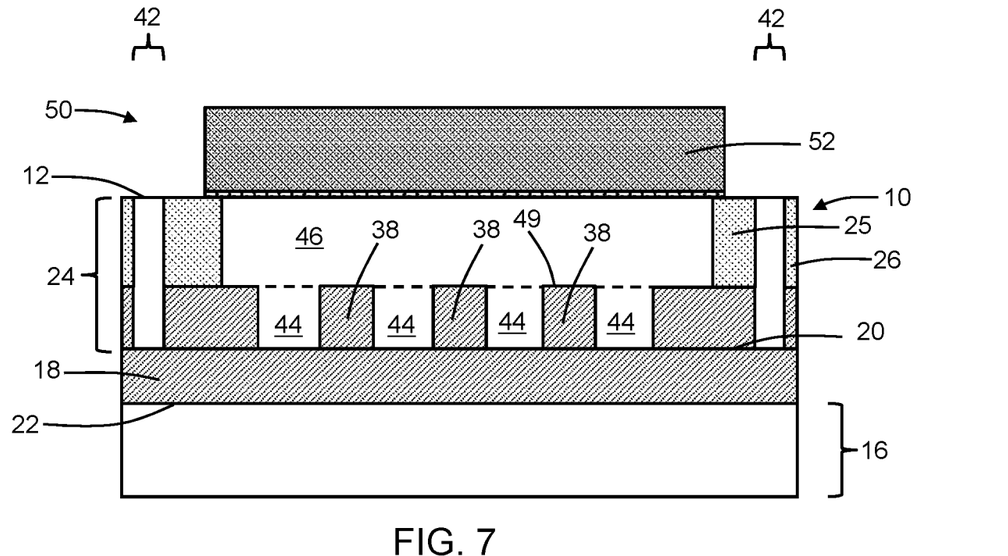
FIGS. 7, 7A, 7B are cross-sectional views of the structure at a fabrication stage subsequent to FIGS. 6, 6A, 6B.
Figure 7A:
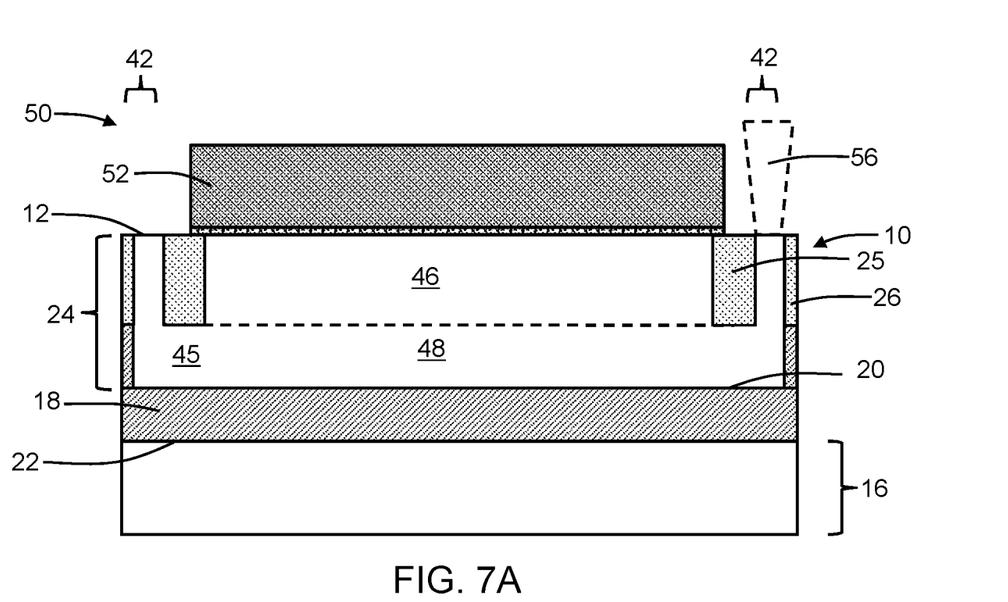
Figure 7B:
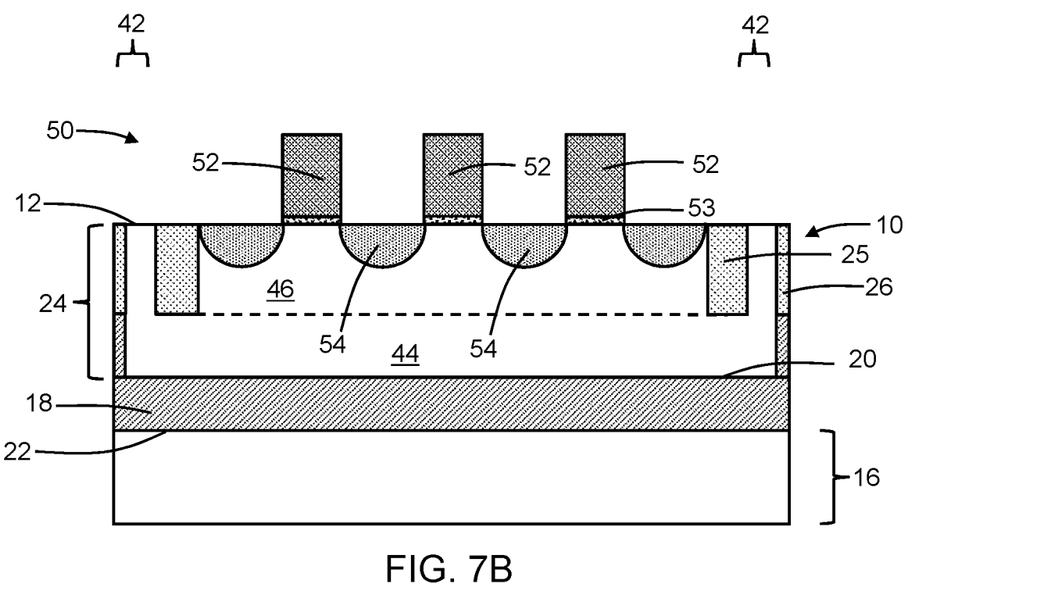

With reference to FIGS. 7, 7A, 7B in which like reference numerals refer to like features in FIGS. 6, 6A, 6B and at a subsequent fabrication stage of the processing method, a field-effect transistor 50 may be fabricated by front-end-of-line (FEOL) processing as a device structure in the device region 46 of the semiconductor substrate 10. The field-effect transistor 50 may include gate electrodes 52 comprised of a conductor, such as doped polycrystalline silicon (i.e., polysilicon) or a work function metal, and gate dielectrics 53 comprised of an electrical insulator, such as silicon dioxide or hafnium oxide. The gate electrodes 52 and associated gate dielectrics 53 may be formed by depositing a layer stack and patterning the layer stack with photolithography and etching processes. The field-effect transistor 50 may include other elements such as halo regions, lightly doped drain extensions, source/drain regions 54 in the well, channel regions as portions of the well between the source/drain regions 54, and sidewall spacers on the gate electrode 52.

In an embodiment, the field-effect transistor 50 may provide a switch field-effect transistor in a radio-frequency circuit, and the field-effect transistor 50 may be connected in series with other similar field-effect transistors in a bank or stack.

Middle-of-line processing and back-end-of-line processing follow, which includes formation of contacts, vias, and wiring for an interconnect structure that is coupled with the field-effect transistor 50. The interconnect structure includes a contact 56 that is coupled with the body contact region 42 and that is used to supply a body bias to the body contact regions 44. Additional body contacts (not shown) may also be coupled with the body contact region 42 at other locations.

The structure including the polycrystalline layer 18 and polycrystalline regions 38, 39, 40 may ease limitations on upward width scaling of switch banks imposed by body contact requirements by increasing the maximum power handling capability (Pmax) and improving linearity. The structure may provide a more evenly-distributed body voltage across a switch bank.

Figure 8:
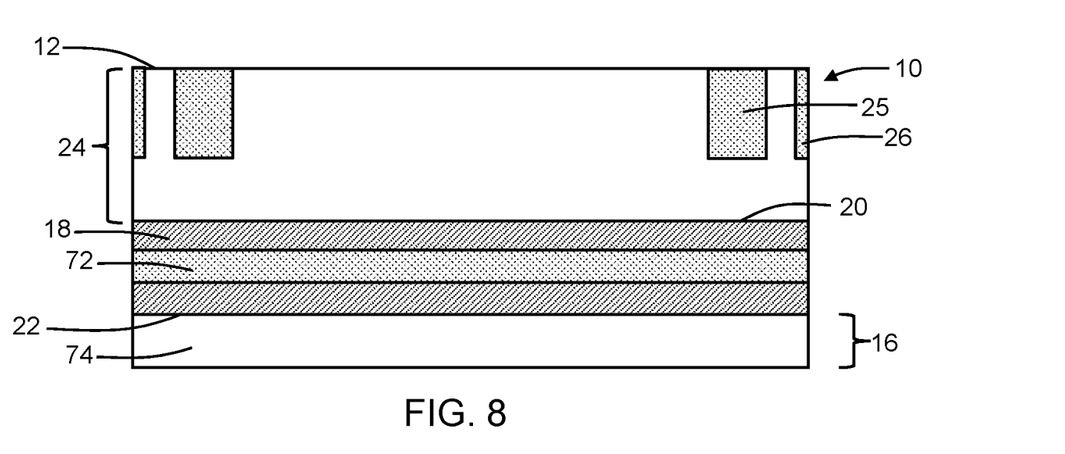
FIG. 8 is a cross-sectional view of a structure in accordance with alternative embodiments of the invention.

With reference to FIG. 8 and in accordance with alternative embodiments, the semiconductor substrate 10 may be a silicon-on-insulator substrate that includes a buried oxide layer 72 and a handle substrate 74. By controlling the implantation conditions for the implanted layer 14, the polycrystalline layer 18 formed by the thermal treatment of the implanted layer 14 may overlap with the buried oxide layer 72 such that a portion of the polycrystalline layer 18 is positioned in the handle substrate 74 below the buried oxide layer 72 and another portion of the polycrystalline layer 18 is positioned above the buried oxide layer 72 and between the buried oxide layer 72 and the top surface 12. For this reason, the buried oxide layer 72 is positioned between the upper and lower boundaries 20, 22 of the polycrystalline layer 18. The recrystallized single-crystal layer 24 is provided by the device layer of the silicon-on-insulator substrate. Processing continues as described in connection with FIGS. 3-7, 7A, 7B.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate comprised of a single-crystal semiconductor material, the semiconductor substrate including a device region and a plurality of first body contact regions each comprised of the single-crystal semiconductor material;
   a polycrystalline layer in the semiconductor substrate; and
   a plurality of polycrystalline regions in the semiconductor substrate, the plurality of polycrystalline regions positioned between the polycrystalline layer and the device region, and the plurality of polycrystalline regions having a laterally-spaced arrangement with a first gap between each adjacent pair of the plurality of polycrystalline regions,
   wherein one of the plurality of first body contact regions is arranged in the first gap between each adjacent pair of the plurality of polycrystalline regions, the polycrystalline layer has a first total thickness, and each polycrystalline region has a second total thickness that is greater than the first total thickness.

2. The structure of claim 1 wherein the semiconductor substrate includes a top surface, and the device region is fully positioned between the plurality of polycrystalline regions and the top surface.

3. The structure of claim 1 wherein the polycrystalline layer and the plurality of polycrystalline regions have a resistivity in a range of 10,000 ohm-cm to 1,000,000 ohm-cm.

4. The structure of claim 1 wherein the semiconductor substrate includes a second body contact region comprised of the single-crystal semiconductor material, and the second body contact region is arranged to fully surround the device region.

5. The structure of claim 4 wherein the semiconductor substrate includes a third body contact region comprised of the single-crystal semiconductor material, and the third body contact region connects the second body contact region with the plurality of first body contact regions.

6. The structure of claim 5 wherein the third body contact region is aligned transverse to the plurality of first body contact regions.

7. The structure of claim 5 wherein the third body contact region extends through a second gap in the plurality of polycrystalline regions to provide a connection between the second body contact region and the plurality of first body contact regions.

8. The structure of claim 4 further comprising:
   a first shallow trench isolation region in the semiconductor substrate, the first shallow trench isolation region fully surrounding the device region, and the first shallow trench isolation region arranged between the second body contact region and the device region.

9. The structure of claim 8 wherein the semiconductor substrate includes a third body contact region comprised of the single-crystal semiconductor material, and the third body contact region extends through a second gap in the plurality of polycrystalline regions and beneath a portion of the first shallow trench isolation region to provide a connection between the second body contact region and the plurality of first body contact regions.

10. The structure of claim 8 further comprising:
    a second shallow trench isolation region in the semiconductor substrate, the second shallow trench isolation region fully surrounding the first shallow trench isolation region,
    wherein the second body contact region is laterally positioned between the first shallow trench isolation region and the second shallow trench isolation region.

11. The structure of claim 1 further comprising:
    a plurality of gate electrodes over the device region; and
    a plurality of source/drain regions in the device region.

12. The structure of claim 1 wherein the polycrystalline layer has an upper boundary, the semiconductor substrate includes a top surface, and the plurality of polycrystalline regions are positioned between the upper boundary of the polycrystalline layer and the top surface of the semiconductor substrate.

13. The structure of claim 1 further comprising:
    a shallow trench isolation region in the semiconductor substrate, the shallow trench isolation region surrounding the device region,
    wherein at least one of the plurality of polycrystalline regions extends from the polycrystalline layer to the shallow trench isolation region.

14. The structure of claim 1 wherein the semiconductor substrate includes a buried oxide layer, and the polycrystalline layer includes a first portion above the buried oxide layer and a second portion below the buried oxide layer.

15. The structure of claim 1 wherein the first gap between each adjacent pair of the plurality of polycrystalline regions is fully filled by one of the plurality of first body contact regions.

16. The structure of claim 1 wherein each first body contact region has a third thickness equal to a difference between the second total thickness and the first total thickness.

17. A method comprising:
    forming a polycrystalline layer in a semiconductor substrate comprised of a single-crystal semiconductor material; and
    forming a plurality of polycrystalline regions in the semiconductor substrate, wherein the semiconductor substrate includes a device region and a plurality of first body contact regions each comprised of the single-crystal semiconductor material, the plurality of polycrystalline regions are positioned between the polycrystalline layer and the device region, the plurality of polycrystalline regions have a laterally-spaced arrangement with a first gap between each adjacent pair of the plurality of polycrystalline regions, one of the plurality of first body contact regions is arranged in the first gap between each adjacent pair of the plurality of polycrystalline regions, the polycrystalline layer has a first total thickness, and each polycrystalline region has a second total thickness that is greater than the first total thickness.

18. The method of claim 17 wherein forming the polycrystalline layer in the semiconductor substrate comprised of the single-crystal semiconductor material comprises:

implanting ions into the semiconductor substrate with a first ion implantation process to amorphize a crystal structure of the single-crystal semiconductor material in an implanted layer; and annealing the semiconductor substrate with a first annealing process to convert the amorphized semiconductor material to form the polycrystalline layer.

19. The method of claim 18 wherein forming the plurality of polycrystalline regions in the semiconductor substrate comprises:

forming a patterned mask on the semiconductor substrate;

implanting ions into the semiconductor substrate with a second ion implantation process to amorphize the crystal structure of the single-crystal semiconductor material in a plurality of implanted regions correlated with the patterned mask; and annealing the semiconductor substrate with a second annealing process to convert the amorphized semiconductor material to form the plurality of polycrystalline regions.

20. The method of claim 17 wherein the semiconductor substrate includes a second body contact region comprised of the single-crystal semiconductor material, and the second body contact region fully surrounds the device region.

* * * * *